United States Patent
Fung

(10) Patent No.: US 9,036,364 B1
(45) Date of Patent: May 19, 2015

(54) CIRCUIT BOARD WITH SIGNAL LAYERS OF DIFFERENT DIMENSIONS TO COMMUNICATE SIGNALS OF DIFFERENT FREQUENCIES

(75) Inventor: Laurie P. Fung, Pleansanton, CA (US)

(73) Assignee: RPX Clearinghouse LLC, San Francisco, CA (US)

( * ) Notice: Subject to any disclaimer, the term of this patent is extended or adjusted under 35 U.S.C. 154(b) by 2191 days.

(21) Appl. No.: 12/002,361

(22) Filed: Dec. 17, 2007

Related U.S. Application Data

(60) Provisional application No. 60/913,561, filed on Apr. 24, 2007.

(51) Int. Cl.
*H05K 1/02* (2006.01)

(52) U.S. Cl.
CPC .................................... *H05K 1/0298* (2013.01)

(58) Field of Classification Search
CPC ............................................... H05K 2201/093
USPC .......... 361/792–795, 794, 760; 174/255, 261; 333/116
See application file for complete search history.

(56) References Cited

U.S. PATENT DOCUMENTS

| | | | |
|---|---|---|---|
| 6,352,914 B2* | 3/2002 | Ball et al. ...................... | 438/599 |
| 6,366,466 B1* | 4/2002 | Leddige et al. ............... | 361/760 |
| 6,495,772 B2* | 12/2002 | Anstrom et al. .............. | 174/255 |
| 6,909,052 B1* | 6/2005 | Haug et al. ..................... | 174/255 |
| 2001/0043130 A1* | 11/2001 | Nagamori et al. ............ | 333/116 |
| 2002/0148637 A1* | 10/2002 | Anstrom et al. .............. | 174/255 |
| 2002/0153613 A1* | 10/2002 | Cheng ........................... | 257/760 |
| 2004/0201971 A1* | 10/2004 | Fessler et al. ................. | 361/780 |
| 2004/0228100 A1* | 11/2004 | Wright .......................... | 361/794 |
| 2005/0029013 A1* | 2/2005 | Lee ................................. | 174/262 |
| 2005/0121766 A1* | 6/2005 | Devnani et al. ............... | 257/691 |
| 2005/0201072 A1* | 9/2005 | He et al. ........................ | 361/794 |
| 2005/0225955 A1* | 10/2005 | Grebenkemper et al. .... | 361/780 |
| 2006/0137907 A1* | 6/2006 | Chheda et al. ................ | 174/262 |

* cited by examiner

*Primary Examiner* — Timothy Thompson
*Assistant Examiner* — Sherman Ng
(74) *Attorney, Agent, or Firm* — Saul Ewing LLP

(57) ABSTRACT

Electronic devices to output signals at different frequencies are mounted to a circuit board that has a group of layers, where the group of layers include reference plane layers and signal layers between the reference plane layers. A first signal layer has conductive traces having a first dimension to communicate the signals at a first frequency, and a second signal layer has conductive traces having a second, different dimension to communicate signals at a second, different frequency. The first and second signal layers are successive layers without any reference plane layer in between the first and second signal layers.

22 Claims, 2 Drawing Sheets

CIRCUIT BOARD WITH SIGNAL LAYERS OF DIFFERENT DIMENSIONS TO COMMUNICATE SIGNALS OF DIFFERENT FREQUENCIES

CROSS-REFERENCE TO RELATED APPLICATIONS

This claims the benefit under 35 U.S.C. §119(e) of U.S. Provisional Application Ser. No. 60/913,561, entitled "Implementation of Variable Copper Trace Widths in Printed Circuit Board (PCB)," filed Apr. 24, 2007, which is hereby incorporated by reference.

TECHNICAL FIELD

The invention relates to a circuit board having signal traces with different dimensions to communicate signals having different frequencies.

BACKGROUND

Circuit boards (often referred to as printed circuit boards) are used in various systems, such as computer systems, communication switch systems, and so forth. With modern technological advances, systems can be packed with electronic devices for different applications. In some cases, the different applications may involve use of signals in different frequency ranges.

A circuit board can have multiple signal layers having signal traces for routing signals associated with electronic devices mounted on the circuit board. Generally, wider signal traces are used to route signals of higher frequencies to avoid the skin loss effect in the signal trace. On the other hand, signal traces for routing signals having lower frequencies can have narrower widths.

It is desirable that the impedance of signal traces be generally the same even though they have different widths. The impedance of a signal trace is defined by the dimensions (thickness and width) of the signal trace, and the signal trace's distance from nearby reference plane(s). To achieve the same impedance, a wider signal trace has to be placed farther away from a reference plane.

As a result, to accommodate signal traces of varying widths for different applications, the overall thickness of a conventional circuit board will be increased, which will adversely impact circuit board fabrication cost and yield. Alternatively, some solutions have been directed at using a split circuit board design, in which an overall circuit board is split into multiple individual circuit boards that are connected together, with each individual circuit board optimized for the particular application. However, using multiple individual circuit boards is costly, and moreover, having to connect multiple individual circuit boards to form the overall circuit board adds to manufacturing complexity.

SUMMARY

In general, according to an embodiment, a circuit board on which electronic devices are mounted can have a group of layers, where the group includes reference plane layers and signal layers between the reference plane layers. Different signal layers in the group can have conductive traces of different dimensions to communicate signals of different frequencies associated with the electronic devices.

In some embodiments, multiple such groups of layers can be stacked to form an overall circuit board.

Other or alternative features will become more apparent from the following description, from the drawings, and from the claims.

DETAILED DESCRIPTION

In the following description, numerous details are set forth to provide an understanding of some embodiments. However, it will be understood by those skilled in the art that some embodiments may be practiced without these details and that numerous variations or modifications from the described embodiments may be possible.

Figure 1:
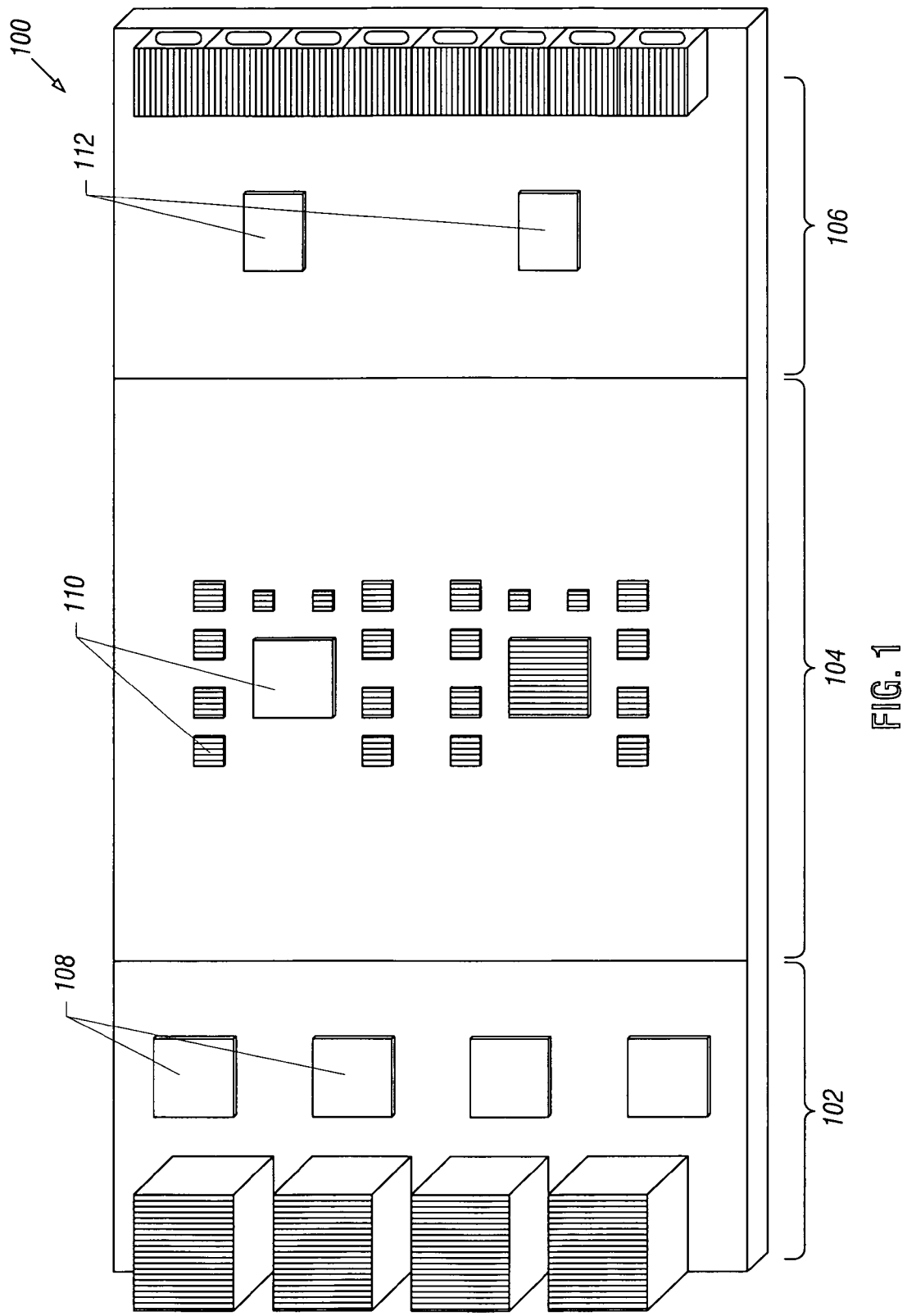
FIG. 1 illustrates a top perspective view of a multi-application circuit board according to an embodiment.

FIG. 1 illustrates an example multi-application circuit board assembly that has a first section 102, a second section 104, and a third section 106 corresponding to the multiple applications. The different sections of the circuit board 100 include electronic devices that can operate in different frequency ranges. For example, the first circuit board section 102 includes electronic devices 108 that operate in a first frequency range, the second circuit board section 104 includes electronic devices 110 that operate in a second frequency range, and the third circuit board section 106 includes electronic devices 112 that operate in a third frequency range. In one specific example embodiment, the multi-application circuit board 100 is part of a communication switch system, with the first section 102 including data exchange electronic devices 108 that provide interface functionality with internal devices of the communication switch system; the second circuit board section 104 including data processing electronic devices 110 to perform processing tasks; and the third circuit board section 106 including electronic devices 112 that provide external interface functionality to communicate with external devices. Thus, in one specific example, the first circuit board section 102 can have devices 108 that operate from 2.5 to 6.5 gigahertz (GHz) and higher, the second section 104 can have devices 110 that operate from 25 to 500 megahertz (MHz) and higher, and the third section 106 can have devices 112 that operate from 1 to 3.5 GHz and higher. Note that the specific frequency ranges are provided for purposes of illustration. In other example implementations, different sections of the circuit board can have devices that operate in other frequency ranges.

Although three sections are depicted in the multi-application circuit board 100 of FIG. 1, note that other multi-application circuit boards can have other numbers (two or greater than three) of sections for different applications.

Since the electronic devices associated with different applications operate in different frequency ranges, signal traces for routing signals associated with the different sections can have different dimensions. Generally, to route a signal having a higher frequency, a signal trace is made wider to reduce the skin loss effect. Conversely, a signal trace for carrying a signal at a lower frequency can have a narrower width, which is generally more space-efficient and is associated with lower circuit board fabrication costs.

More generally, signal traces in different signal layers for carrying signals of different frequencies can be set to have different dimensions (e.g., widths and/or thicknesses). In accordance with some embodiments, to enhance efficiency of circuit board layout and to reduce circuit board fabrication costs, groups of layers can be defined, with each group having an arrangement of reference plane layers and signal layers that allows for a reduced thickness of the group of layers, such that the overall circuit board can be made to have a reduced thickness. Reducing the overall thickness of the circuit board increases space usage efficiency in a system, reduces fabrication costs, and reduces the amount of material that has to be used for making the circuit board.

Figure 2:
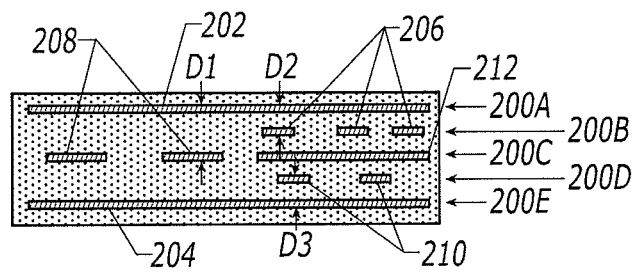
FIG. 2 is a cross-sectional view of a group of layers in the circuit board of FIG. 1, according to an embodiment.

FIG. 2 shows a group of layers according to an embodiment. The group of layers includes layers 200A, 200B, 200C, 200D, and 200E, where layers 200A and 200E (also referred to as "reference plane layers") include reference planes 202 and 204, respectively, and layers 200B, 200C, 200D are signal layers. The signal layer 200B has signal traces 206, the signal layer 200C has signal traces 208, and the signal layer 200D has signal traces 210. The signal traces are formed of an electrically conductive material (e.g., copper, etc.). The reference planes 202, 204 can be any combination of power supply reference planes and ground reference planes. For example, both reference planes 202 and 204 can be ground reference planes, or both reference planes 202 and 204 can be power supply reference planes, or the reference plane 202 can be a ground reference plane and the reference plane 204 can be a power supply reference plane (or vice versa). A power supply reference plane generally refers to a layer formed of an electrically conductive material (e.g., cooper, etc.) that is used to carry a constant (or regulated) power supply (positive or negative) voltage. A ground reference plane refers to a layer of electrically conductive material (e.g., copper, etc.) to carry a constant (or regulated) low reference voltage (e.g., zero volts or other ground or low voltage).

As depicted in FIG. 2, signal traces 208 in layer 200C are wider than signal traces 206, 210 in layers 200B, 200D. In the example of FIG. 2, signal traces 206 and 210 can have the same widths (or alternatively, they can have different widths). The signal traces 208 are used to carry signals from electronic devices associated with a first section of a circuit board that is associated with a higher frequency range. The signal traces 206, 210 are used to carry signals associated with another section (or other sections) of the circuit board associated with a lower frequency range (or lower frequency ranges).

A feature of the group of layers depicted in FIG. 2 is that the signal traces 206, 208, and 210 are embedded in a space between the reference planes 202, 204.

Successive layers in the group of FIG. 2 are separated from each other by dielectric material of the circuit board. The successive (or neighboring) reference/signal layers are separated by a dielectric material to provide electrical insulation between the layers.

To reduce the thickness of the group of layers, note that no reference plane layer is provided between signal layer 200B and signal layer 200C. Similarly, no reference plane layer is provided between signal layer 200C and signal layer 200D.

Figure 3:
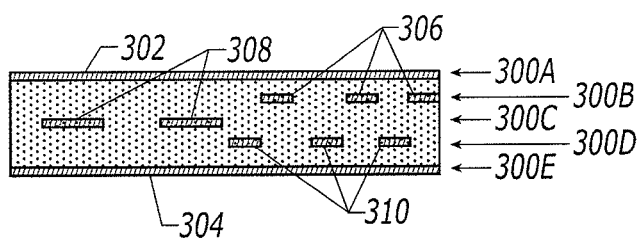
FIG. 3 is a cross-sectional view of a group of layers of the circuit board according to another embodiment.

In the embodiment depicted in FIG. 2, a reference trace 212 (e.g., a ground reference trace or a power supply reference trace) is also provided in the signal layer 200C to be disposed between signal layers 200B and 200D. The reference trace 212 carries a reference voltage (e.g., power supply voltage or ground voltage). Note that the reference trace 212 is wider than any of signal traces 206, 208, 210, and in fact, is wide enough to at least cover all of signal traces 206 and 210. In a different embodiment, the reference trace 212 can be omitted, which is illustrated in FIG. 3 (discussed further below).

By not providing reference plane layers between signal layers having signal traces of different widths, the thickness associated with each such reference plane layer can be omitted such that the overall thickness of the group of layers depicted in FIG. 2 can be reduced. In other words, the number of layers that has to be provided in the group can be reduced. Being able to omit reference plane layers between signal layers having signal traces of different widths allows for the overall circuit board to have a smaller number of layers, which helps to reduce the overall thickness of the circuit board.

Note that the spacing or vertical distance (distance along an axis that is generally perpendicular to each of the layers) between the signal traces 208 (in signal layer 200C) and the reference plane 202 is D1, which is larger than the vertical distance (spacing) D2 between signal traces 206 (in the signal layer 200B) and the reference plane 202. The different distances between signal traces 208 and the reference plane 202 and between the signal traces 206 and reference plane 202 are provided to allow for the signal traces 206 and 208 to achieve generally the same impedance (to within manufacturing tolerances) even though the signal traces 206, 208 have different widths and/or thicknesses. The impedance of a signal trace is defined by its dimensions (thickness and width) as well as by the distance between the signal trace and a nearby reference plane(s). A wider signal trace tends to decrease the impedance of the signal trace, while increasing the distance of the signal trace to nearby reference plane(s) tends to increase the impedance of the signal trace. Therefore, by increasing the spacing of wider signal traces 208 from the reference plane 202 as compared to the spacing between signal traces 206 and the reference plane 202, the signal traces 206 and 208 can be set to achieve generally the same impedance.

Note that the spacing between signal traces 208 and the reference plane 204 can also be D1. In the embodiment of FIG. 2, the spacing between signal traces 206 and the reference trace 212 (in layer 200C) can also be set at D2.

The spacing between signal traces 210 and the reference plane 204 is D3, where D3 can be the same as D2 if signal traces 210 have the same width as signal traces 206. Moreover, the distance between signal traces 210 and the reference trace 212 is also D3.

In general, a group of layers that includes reference plane layers and signal layers is provided to route signals associated with multiple applications (that are associated with different frequency ranges). The group is designed such that the number of reference plane layers that are associated with the signal layers containing signal traces of different widths for routing signals for different applications is reduced. In one embodiment, the group is a group of N layers, where N≥5, and where at least some of the signal layers in the group that have signal traces of different dimensions are provided without reference plane layers between the at least some signal layers.

FIG. 3 shows a group of layers according to a different embodiment, where the group includes layers 300A-300E, where top layer 300A contains the reference plane 302, bottom layer 300E contains a reference plane 304, and intermediate layers 300B-300D are signal layers that contain respective signal traces 306, 308, and 310. Note that the signal traces 308 are generally wider than signal traces 306 and 310 (similar to the embodiment depicted in FIG. 2). However, in the embodiment of FIG. 3, the signal layer 300C does not contain a reference trace (such as reference trace 212 in FIG. 2).

Each of FIGS. 2 and 3 illustrate a corresponding example group of layers that includes reference plane layers and signal layers. To form a circuit board, multiple such groups of layers can be stacked. At least some of the groups of layers in the circuit board can have identical arrangements, while at least some others of the groups of layers can have different arrangements. For example, in a circuit board, a first group of layers can have a different arrangement from a second group of layers, while the first group of layers can have an identical arrangement as a third group of layers elsewhere in the circuit board.

Figure 4:
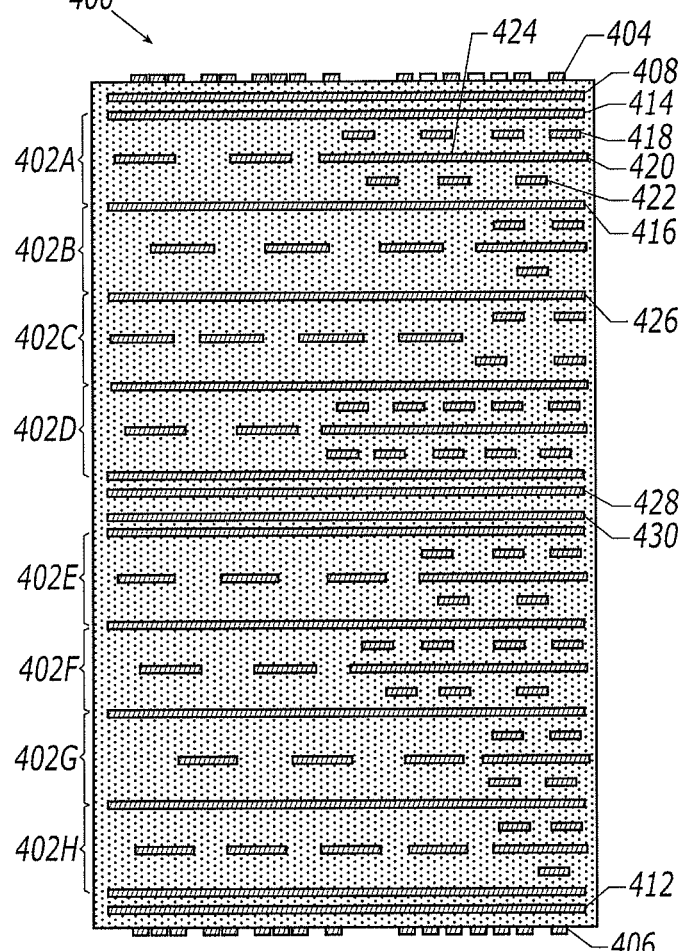
FIG. 4 is a cross-sectional view of multiple stacked groups of layers of the circuit board of FIG. 1, according to a further embodiment.

An example arrangement of stacked groups of layers is depicted in FIG. 4. FIG. 4 shows an example circuit board 400 having stacked groups (402A, 402B, 402C, 402D, 402E, 402F, 402G, 402H) of layers. A top layer 404 of the circuit board 400 has signal traces for connection to electronic devices mounted to a top surface of the circuit board 400. The signal traces in the top signal layer 404 can be microstrip traces, for example. Similarly, a bottom signal layer 406 has signal traces (e.g., microstrip traces) for connection to electronic devices mounted to a bottom surface of the circuit board 400.

Next to the top signal layer 404 is a power plane layer 408, and next to the bottom signal layer 406 is a power plane layer 412. Below the power plane layer 408 is the group 402A of layers, which has ground plane layers 414 and 416, and signal layers 418, 420, and 422, where the signal layer 420 has wider signal traces and the signal layers 418 and 422 have narrower signal traces. The signal layer 420 also has a reference trace 424. The group 402A thus has an arrangement similar to the group depicted in FIG. 2.

The next group 402B of layers includes the ground plane layer 416 and another ground plane layer 426. Note that the ground plane layer 416 is shared between groups 402A and 402B for enhanced circuit board layout efficiency. The group 402B also has an arrangement similar to the arrangement of FIG. 2.

The other groups that have arrangements similar to the FIG. 2 arrangement are groups 402D, 402E, 402F, 402G, and 402H. On the other hand, group 402C has an arrangement similar to the FIG. 3 arrangement (where a reference trace is not provided in the middle signal layer).

In addition to the groups 402A-402H, power plane layers 428 and 430 are provided between groups 402D and 402E. Note that the locations of the various power plane layers are provided for purposes of example. In other implementations, other locations of power plane layers can be provided. Moreover, note that in the circuit board 400, any of the reference plane layers (power plane layers or ground plane layers) can be replaced with a different type of reference plane layer. Thus, for example, any of the power plane layers in FIG. 4 can be replaced with a ground plane layer, and vice versa. FIG. 4 shows an example circuit board 400 in which each of the groups 402 has an arrangement different from any other group. However, note that in other implementations, at least some of the groups can have identical arrangements.

By using a circuit board according to some embodiments, a circuit board with a reduced overall thickness can be achieved, such that fabrication cost can be reduced and material cost can also be reduced (since a thinner circuit board requires less material). Further, manufacturing circuit boards with a smaller number of layers enhances the yield of such circuit boards, which enhances manufacturing efficiency. No special tooling is required to manufacture circuit boards according to some embodiments.

In the foregoing description, numerous details are set forth to provide an understanding of the present invention. However, it will be understood by those skilled in the art that the present invention may be practiced without these details.

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. An apparatus comprising:
   electronic devices to output signals at different frequencies;
   a circuit board, the electronic devices being mounted to the circuit board, the circuit board having a first group of layers comprising:
   reference plane layers;
   signal layers between the reference plane layers, wherein a first of the signal layers has conductive traces having a first dimension to communicate signals at a first frequency, and a second of the signal layers has conductive traces having a second, different dimension to communicate the signals at a second, different frequency;
   wherein the first and second signal layers are successive layers without any reference plane layer in between the first and second signal layers and the first of the signal layers is a first distance from at least one of the reference plane layers and the second of the signal layers is a second distance, different than the first distance, from the at least one of the reference planes, wherein the first and second distances are such that an impedance of the conductive traces of the first signal layer having the first dimension is matched to an impedance of the conductive traces of the second signal layer having the second dimension.

2. The apparatus of claim 1, wherein the signal layers further include a third signal layer between the reference plane layers, the third layer having conductive traces having a third dimension to communicate the signals at a third frequency different from the first and second frequencies and wherein the third of the signal layers is a third distance from at least one of the reference plane layers, wherein the third distance is such that an impedance of the conductive traces of the third signal layer having the third dimension is matched to the impedance of the conductive traces of the first and second signal layers having the first and second dimensions, respectively.

3. The apparatus of claim 2, wherein the second and third signal layers are successive layers without any reference plane layer between the second and third layers.

4. The apparatus of claim 3, wherein the first, second, and third dimensions comprise first, second, and third widths, and wherein the second width is greater than the first and third widths.

5. The apparatus of claim 3, wherein the second signal layer further comprises a reference trace to carry a reference voltage, wherein the reference voltage is one of a power supply voltage and ground voltage and is the same voltage as one of the reference plane layers.

6. The apparatus of claim 5, wherein the first distance is defined between the first signal layer and a first of the reference plane layers, and the second distance is defined between the second signal layer and the first reference plane layer.

7. The apparatus of claim 6, wherein the first distance is defined between the first signal layer and the reference trace.

8. The apparatus of claim 6, wherein the first distance is defined between the third signal layer and a second of the reference plane layers, and the second distance is defined between the second signal layer and the second reference plane layer.

9. The apparatus of claim 8, wherein the first distance is defined between the third signal layer and the reference trace.

10. The apparatus of claim 3, wherein the second signal layer is without a reference trace to carry a reference voltage.

11. The apparatus of claim 1, wherein the reference plane layers comprise any combination of power supply voltage plane layers and ground plane layers.

12. The apparatus of claim 1, further comprising a second group of layers, wherein a number of layers in the second group is the same as a number of layers in the first group, the second group comprising:
  second group reference plane layers; and
  second group signal layers between the second group reference plane layers, wherein a first of the second group signal layers has conductive traces having the first dimension and a second of the second group signal layers has conductive traces having the second dimension, wherein the first and second signal layers of the second group are successive layers without any reference plane layer therebetween and the first of the signal layers is a fourth distance from at least one of the reference plane layers and the second of the signal layers is a fifth distance, different than the third distance, from at least one of the reference planes, wherein the fourth and fifth distances are such that an impedance of the conductive traces of the first signal layer of the second group having the first dimension is matched to an impedance of the conductive traces of the second signal layer of the second group having the second dimension.

13. The apparatus of claim 1, wherein the first dimension is a first width and the second dimension is a second width.

14. The apparatus of claim 1, wherein the circuit board further comprises additional first groups of layers, wherein at least some of the first groups of layers have different arrangements.

15. The apparatus of claim 1, wherein the electronic devices are associated with different applications that operate at the different frequencies.

16. The apparatus of claim 1, wherein the first signal layer has the conductive traces to communicate signals in a first frequency range, wherein the first frequency is in the first frequency range, and the second signal layer has the conductive traces to communicate signals in a second frequency range, wherein the second frequency is in the second frequency range.

17. A circuit board comprising:
  a first group of layers including:
    reference plane layers;
    signal layers between the reference plane layers, wherein a first of the signal layers has conductive traces having a first width to communicate signals in a first frequency range, and a second of the signal layers has conductive traces having a second, different width to communicate signals at a second, different frequency,
    wherein the first and second signal layers are successive layers without any reference plane layer between the first and second signal layers and a first distance between the first of the signal layers is a first distance from at least one of the reference plane layers and the second of the signal layers is a second distance from at least one of the reference planes, wherein the first and second distances are such that an impedance of the conductive traces of the first signal layer having the first dimension is matched to an impedance of the conductive traces of the second signal layer having the second dimension;
  a second group of layers including:
    reference plane layers; and
    signal layers between the reference plane layers of the second group, wherein a first of the signal layers in the second group has conductive traces having a first width to communicate the signals in the first frequency range, and a second of the signal layers in the second group has conductive traces having the second dimension to communicate the signals in the second frequency range,
    wherein the first and second signal layers of the second group are successive layers without any reference plane layer in between the first and second signal layers of the second group and the first of the signal layers of the second group is a third distance from at least one of the reference plane layers of the second group and the second of the signal layers of the second group is a fourth distance, different than the first distance, from at least one of the reference planes of the second group wherein the third and fourth distances are such that an impedance of the conductive traces of the first signal layer of the second group having the first dimension is matched to an impedance of the conductive traces of the second signal layer of the second group having the second dimension,
  wherein the first and second groups have different arrangements.

18. The circuit board of claim 17, wherein the first and second groups share one of the reference plane layers.

19. The circuit board of claim 17, further comprising a third group of layers including:
  reference plane layers;
  signal layers between the reference plane layers of the third group, wherein a first of the signal layers of the third group has conductive traces having the first width to communicate the signals in the first frequency range, and a second of the signal layers in the third group has conductive traces having the second width to communicate the signals in the second frequency range, wherein the first and second signal layers of the third group are successive layers without any reference plane layer in between the first and second signal layers of the third group.

20. The apparatus of claim 19, wherein the third group has an identical arrangement as the first group.

21. A method of making a circuit board assembly, comprising:
  mounting electronic devices that operate in different frequency ranges to a circuit board that has a first group of layers;
  providing reference plane layers in the first group;
  providing signal layers between the reference plane layers in the first group, wherein a first of the signal layers has conductive traces having a first width to communicate signals in a first frequency range, and a second of the signal layers has conductive traces having a second, different width to communicate signals in a second, different frequency range, wherein the first and second signal layers are successive layers without any reference plane layer in between the first and second signal layers and the first of the signal layers is a first distance from at least one of the reference plane layers and the second of the signal layers is a second distance, different than the first distance, from at least one of the reference planes, wherein the first and second distances are such that an impedance of the conductive traces of the first signal layer having the first dimension is matched to an impedance of the conductive traces of the second signal layer having the second dimension.

22. The method of claim 21, wherein providing the electronic devices comprises providing electronic devices associated with a communications system having different applications.

\* \* \* \* \*